(12) United States Patent
Mol

(10) Patent No.: US 9,933,280 B2
(45) Date of Patent: Apr. 3, 2018

(54) SENSOR ASSEMBLY FOR USE IN SENSOR BEARINGS

(71) Applicant: AKTIEBOLAGET SKF, Göteborg (SE)

(72) Inventor: Hendrik Anne Mol, Sleeuwijk (NL)

(73) Assignee: AKTIEBOLAGET SKF, Gothenburg (SE)

(*) Notice: Subject to any disclaimer, the term of this patent is extended or adjusted under 35 U.S.C. 154(b) by 49 days.

(21) Appl. No.: 14/891,368

(22) PCT Filed: May 15, 2014

(86) PCT No.: PCT/EP2014/060005
§ 371 (c)(1),
(2) Date: Nov. 16, 2015

(87) PCT Pub. No.: WO2014/187729
PCT Pub. Date: Nov. 27, 2014

(65) Prior Publication Data
US 2016/0146632 A1 May 26, 2016

(30) Foreign Application Priority Data

May 22, 2013 (WO) .................. PCT/EP2013/060486

(51) Int. Cl.
*G01D 5/14* (2006.01)
*G01D 5/244* (2006.01)
(Continued)

(52) U.S. Cl.
CPC ............ *G01D 5/145* (2013.01); *G01D 5/2448* (2013.01); *G01D 5/24485* (2013.01); *G01P 3/487* (2013.01); *H01L 43/14* (2013.01)

(58) Field of Classification Search
CPC ...... G01D 5/145; G01D 5/142; G01D 11/245; G01R 33/07; G01B 7/003
(Continued)

(56) References Cited

U.S. PATENT DOCUMENTS 2,536,805 A * 1/1951 Hansen, Jr. .......... H04R 23/006
310/216.002
4,123,772 A * 10/1978 Janssen ................ H01L 43/065
257/427
(Continued)

FOREIGN PATENT DOCUMENTS

CN 101400971 A 4/2009
CN 201348929 Y 11/2009
(Continued)

OTHER PUBLICATIONS

Popovic, R. S. "Hall-effect devices." Sensors and Actuators 17.1-2 (1989): 39-53.*

*Primary Examiner* — Jermele M Hollington
*Assistant Examiner* — Christopher McAndrew
(74) *Attorney, Agent, or Firm* — Bryan Peckjian; SKF USA Inc. Patent Dept.

(57) ABSTRACT

A sensor assembly for use in sensor bearings, the sensor assembly comprising at least two sensor units configured to be arranged on a ring of the sensor bearing in different angular positions with regard to the rotation axis of the bearing. Each of the sensor units includes at least one hall sensor plate. At least two hall sensor plates of different sensor units are wired in an antiparallel orientation in order to compensate offset voltages of the hall sensor plates.

9 Claims, 4 Drawing Sheets

(51) Int. Cl.
*G01P 3/487* (2006.01)
*H01L 43/14* (2006.01)

(58) Field of Classification Search
USPC .................................................. 324/207.2
See application file for complete search history.

(56) References Cited

U.S. PATENT DOCUMENTS

| | | | |
|---|---|---|---|
| 4,163,326 A | 8/1979 | Edwards | |
| 6,433,535 B1* | 8/2002 | Marx | G01D 5/16 |
| | | | 324/207.21 |
| 6,768,301 B1* | 7/2004 | Hohe | G01R 33/0094 |
| | | | 324/225 |
| 2002/0190709 A1 | 12/2002 | Frederick et al. | |
| 2005/0162154 A1* | 7/2005 | Mol | G01P 3/487 |
| | | | 324/174 |
| 2007/0013324 A1* | 1/2007 | Ubelein | B60J 1/17 |
| | | | 318/34 |
| 2007/0074587 A1* | 4/2007 | Mol | G01L 5/0019 |
| | | | 73/862.322 |
| 2007/0143039 A1* | 6/2007 | Mol | G01L 5/0009 |
| | | | 702/41 |
| 2009/0115409 A1 | 5/2009 | Arinaga et al. | |
| 2009/0219016 A1 | 9/2009 | Debrailly | |
| 2011/0147865 A1* | 6/2011 | Erie | H01L 43/065 |
| | | | 257/421 |
| 2012/0025812 A1 | 2/2012 | Dolsak | |
| 2013/0080087 A1 | 3/2013 | Donovan et al. | |
| 2014/0361766 A1* | 12/2014 | Rohrer | G01R 33/0094 |
| | | | 324/251 |

FOREIGN PATENT DOCUMENTS

| | | |
|---|---|---|
| CN | 102472636 Y | 5/2012 |
| EP | 0795463 A1 | 9/1997 |
| EP | 1967824 A1 | 9/2008 |
| WO | 2012140465 A1 | 10/2012 |

* cited by examiner

SENSOR ASSEMBLY FOR USE IN SENSOR BEARINGS

CROSS REFERENCE TO RELATED APPLICATIONS

This is a United States National Stage Application claiming the benefit of International Application Number PCT/EP2014/060005 filed on 15 May 2014, which claims the benefit of Europe (EP) Patent Application PCT/EP2013/060486 filed on 22 May 2013, both of which are incorporated herein by reference in their entireties.

TECHNICAL FIELD

The invention relates to a sensor assembly for use in sensor bearings and to a method for manufacturing a sensor assembly.

TECHNICAL BACKGROUND

Sensor bearings including absolute angle sensors are widely used to serve motion control, electric motor control and commutation, in particular at high temperatures and/or speeds. Such motor application fields could be mining, cement, minerals, drilling of oil/gas, processes in chemistry and mineral refining, off-road electrically driven vehicles, hybrid and electrical cars and trucks, and motors for auxiliary equipment around internal combustion engines such as sensors for the motors/generators of electrically supported turbocompression, electrical air inlet compressor, double clutch actuator motors, turbo variable geometry actuators, turbo waste valve actuators, air heating, cooling and ventilation compressors, water pumps, start-stop motor-alternators, mild and full hybrid electric motor-generators.

Absolute angle sensing devices for use in bearings are usually made of a magnetic ring with at least one north and one south pole, and a collection of two of more isotropically distributed analogue Hall sensors with regular spacing. Adding the signals with the correct weight makes it possible to directly present output voltages representing the sine and cosine of the angle of the (usually) rotating magnet ring with respect to the (usually) fixed) sensor collection.

An angle sensing bearings with semiconductor sensors are normally limited to ambient temperatures below the range of 150-175° C. due to the need of highly integrated magnetic sensors as well as analogue and/or digital signal treatment parts produced in silicon (e.g. op-amps, AD converters etc). There are signal processing components available for ambient temperatures beyond 175° C. but they are 100 to 1000 times more expensive than their automotive grade equivalents as used for industrial sensor bearings.

High temperature magnetic sensors are feasible however, usually in the form of Hall plates with sensor areas (in the shape of maltese cross design) in high temperature semiconductors of the GaAs, GaN or SiC instead of Si materials. These Hall elements are today commercially available in GaAs but without any amplification, buffering or on-board signal treatment. The integration level of all analogue and digital processing in Silicon has entailed the massive success and subsequent multi billion pieces/year volumes and thereby low cost silicon Hall sensors and is not available in high temperature semiconductors today.

The cost restrictions applicable in the automotive industry impose strong limits on the possible choices of absolute angle sensors for bearings. For applications where high temperatures are likely to occur such as wheel bearings close to brakes or bearings in internal combustion engines, these limitations do not allow for the use of signal processing elements such as amplifiers and only elementary Hall sensors and passive components can be used.

One of the problems when using high temperature magnetic sensors is that these sensors, e.g. GaAs based Hall elements, have large offset, gain and other variations with respect to the average parameters.

However, the common manufacturing process has the capability to very accurately reproduce these errors in all such Hall elements spread over the same wafer. This means that the Hall bridge resistances, the Hall voltage offset and the Hall gain of these Hall elements may deviate strongly from the typical specification from batch to batch but within one batch of sensors, these numbers will be very constant.

SUMMARY OF THE INVENTION

In order to provide a arrangement for absolute angle sensing in sensor bearings meeting the requirements of the industry in terms of cost and volume, the invention therefore proposes to use at least two Hall plates in particular cut from one semiconductor wafer and to wire the Hall plates so as to form a compensation circuit compensating the tolerances resulting in variations offset, gain or other parameters of the individual Hall plates. The Hall resistances being nearly identical for individuals from one wafer, it is possible to directly put the sensor output wiring in parallel or anti-parallel according to the needs.

It is possible to combine such Hall plates in pairs with anti-parallel wiring, such that the circuit of two such sensors cancels in particular the offset without further calibration In an embodiment of the invention, it is proposed to distribute a multitude of sensor units each including one pair of Hall plates, where the individuals per pair are set up as "differential" magnetic field sensors with antiparallel wiring, and distribute the sensor units around the magnetic ring circumference in a meaningful geometric pattern to have a sine and cosine output while also suppressing or attenuating unwanted harmonic content of the magnetic field of the magnetic ring.

In a preferred embodiment of the invention, it is proposed that the Hall plates are GaAs plates. The Offset voltage Voffset is found to be highly reproducible in GaAs based cells, in particular when stemming from one wafer unlike in Silicon based cells. Then, these cells can be arranged around the magnetic ring, in a way such that they sample the field variation due to the magnetic ring being sensed. The cancellation of the offset is preferably done by using a pair of sensors electrically connected in anti-parallel fashion.

If no magnetic ring is feasible, which might be the case when the object is rotating with a speed where the centrifugal force prohibits the use of magnetic rings based on our commonly available materials, then a variable reluctance solution is in principle possible too. This solution would require sensor pairs forming a differential bridge, a bias magnet system and a ferritic steel ring shaped to vary the magnetic field direction and strength such that it is easy to observe by the two closely spaced hall elements in anti-parallel wiring. The offset thus being cancelled, as well as the total bias field result being cancelled, only the modulation of the size and direction of the field will be visible. Combining a number of regularly spaced pairs of sensors will then allow a variable reluctance based absolute angle sensing system which not only can run at higher than ordinarily feasible temperature but also achieve this at high speed.

The invention preferably uses a diametrical magnetic ring to provide a (reasonable) magnetic field and pairs of Hall sensors arranged around this ring following optimization rules layed out in this text. The Hall sensors provide in fact a voltage output which is the in-product of the magnetic vector from the ring with the sensitivity axis of the sensors. This voltage is thus a function of the angle that can be described by a Fourier sum of functions representing the (required) sine of the angle a and its (generally unwanted) higher harmonics i.e. sin(n*a), wherein n≥2. For a well behaved magnetic ring, the field is symmetrical thereby the even harmonics are generally very small.

The ring may also have more than one pole pair. For the purpose of explaining the invention, we assume one pole pair. When the invention is generalized to rings with more than one pole, the phase delays given below relate to phase angles in relation to the period of the magnetic pattern of the ring, wherein the phase angles are to be taken modulo the period.

The known silicon based analogue Hall sensors are massively employed, and contain all qualities that the CMOS and mixed signal manufacturing in standard silicon wafers can bring except for performance at high temperatures. Beyond 175 degrees C. practically the leakage currents dominate the signals and the sensors are no longer usable.

The sensors that can be used at high temperature are generally made of a semiconductor material with a sufficient band gap between valence and conduction bands so that the thermally generated leakage currents at high temperatures are sufficiently small. Devices that have become recently available include Hall sensors made in GaAs. The Hall elements thus made consist of just the Hall plates in monolithic semiconductor material, and it does generally not contain active electronic components like operational amplifiers, multiplexers etc. However, such components might become available at reasonable costs for high-temperature applications in the future. The voltage is available as a differential output. These sensors behave like resistor bridges and voltage sources described in detail below.

A further problem in a number applications is that the signals are essentially the subtle DC signals as output from the arrangements shown in the figures, which may not be feasible in a high electromagnetic noise level environment such as an electrical motor with vector drive. According to one aspect of the invention, it is proposed that the Hall sensor arrangement is therefore driven with an AC supply with a carrier frequency generated by the controller unit that needs to interpret it. The AC drive can be applied under the condition that the substrate of the Hall sensors is biased with DC to form a good non-conducting and low capacitance barrier, avoiding current leakage between Hall element and substrate. The differential AC signals can be filtered and amplified and then using synchronous detection of the amplitude response can be demodulated back to the representative values. In this way, the semiconductors are effectively mimicking more complex and bulky inductive units such as commonly used RVDTs and Resolvers, while staying backwards compatible with these already known and designed-in components.

The above description of the invention as well as the appended claims, figures and the following description of preferred embodiments show multiple characterizing features of the invention in specific combinations. The skilled person will easily be able to consider further combinations or sub-combinations of these features in order to adapt the invention as defined in the claims to his or her specific needs.

DETAILED DESCRIPTION OF THE EMBODIMENTS

Figure 1:
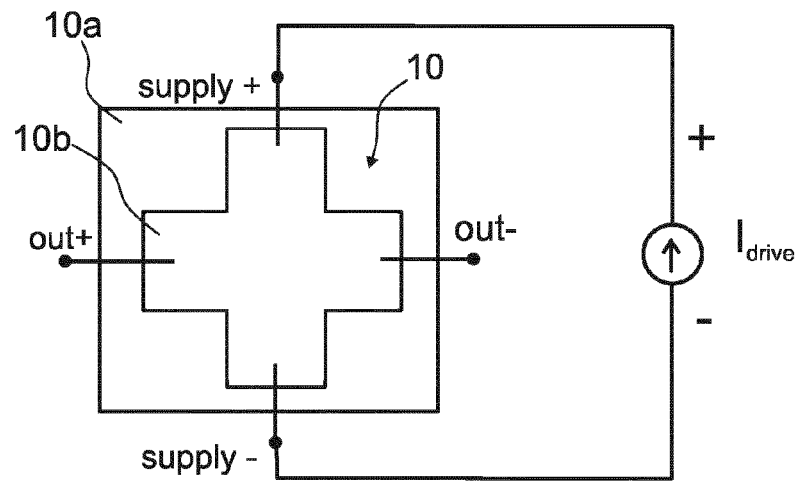
FIG. 1. is a schematic diagram of a wired high temperature Hall sensor plate for use in an arrangement of the present invention.

FIG. 1 illustrates a schematic diagram of a wired high-temperature Hall sensor plate 10 for use in an arrangement of the present invention. The Hall sensor plate 10 basically consists of a GaAs die 10a as a semi-conductor substrate and a magnetic field detecting portion 10b formed as a Greek cross or Maltese cross with a suitable sequence of doping layers.

Four connector terminals are provided, one at the end of each leg of the cross-shaped active Hall region 10b.

Electrical supply current flowing from one connector terminal to another connector terminal opposite to the one connector terminal is biased by a magnetic field oriented perpendicular to the plain of the drawing and to the plain of the plate 10a due to the magnetic forces acting on the charge carriers such that a Hall voltage can be measured at the terminals provided on the legs oriented perpendicular to the legs provided with the one connector and the connector on the opposite side.

In the situation illustrated in FIG. 1, the supply current would flow from the connector on the bottom to the connecter on the top of the Hall sensor plate 10 and a Hall voltage could be measured between the connectors labeled with out+ and out−.

Figure 2:
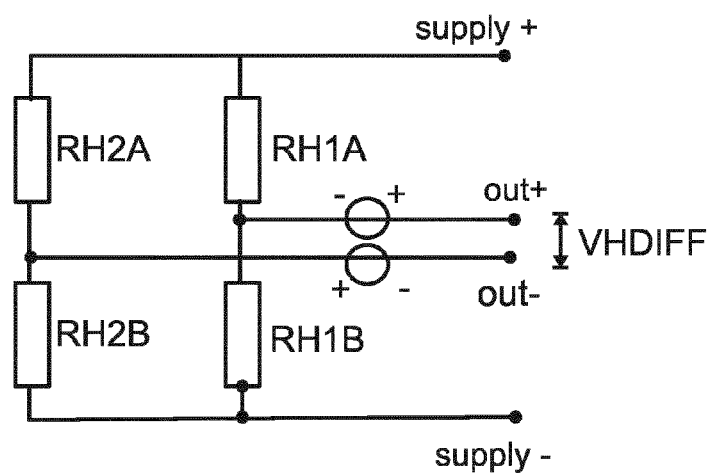
FIG. 2 is an equivalent circuit of the wired high temperature Hall sensor plate of FIG. 1.

FIG. 2 illustrates an equivalent circuit for the Hall plate of FIG. 1. The four legs of the Hall plate including the connectors are equivalent to four resistors connected as illustrated in FIG. 2, wherein the resistance values RH2A, RH2B, RH1A, RH1B depend on the magnetic field component perpendicular to the plate 10 in FIG. 1. The Hall voltage is illustrated as VHDIFF.

Figure 3:
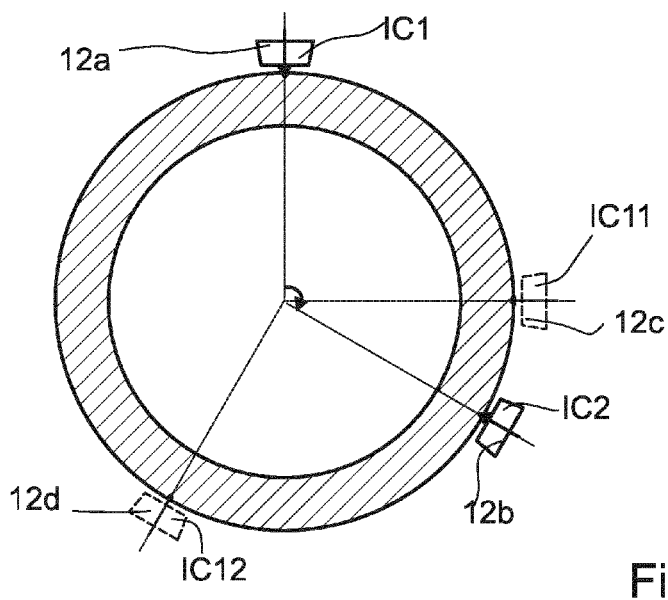
FIG. 3 is a schematical representation of a first embodiment of the invention.

FIG. 3 illustrates an arrangement of four Hall sensors IC1, IC2, IC11 and IC12 each constituting one sensor unit 12a-12d provided with a housing (not shown) and mounted on a bearing ring. The four Hall sensor units 12a-12d are connected in pairs, the first pair comprising the Hall sensor IC1 and the Hall sensor IC2 and the second pair comprising the Hall sensor IC11 and the Hall sensor IC12.

Figure 4:
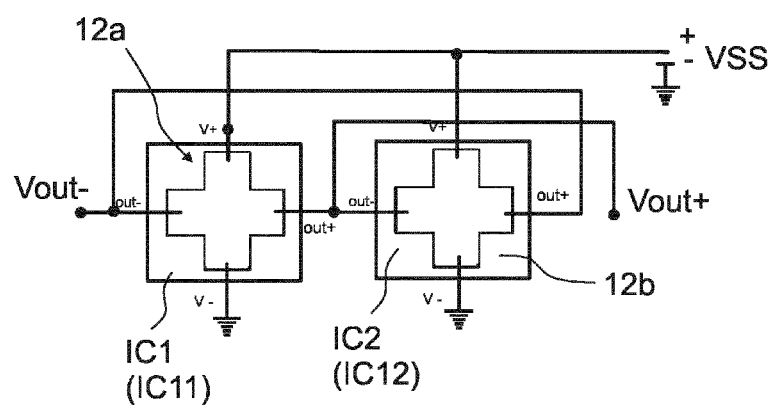
FIG. 4 is a schematical representation of a wiring scheme of the sensor arrangement according to FIG. 3.

Within each pair, the Hall sensors are connected in an identical way, which is illustrated in FIG. 4. The Hall sensors within one pair are identical Hall sensors according to FIG. 1, wherein the sensor plates 10 are made in the same manufacturing process and are cut from the same semiconductor wafer such that the properties thereof are highly similar. The differences in resistances, offset voltages etc. are smaller than the differences which would be measured when comparing sensor plates 10 taken from different batches manufactured from different semi-conductor wafers.

The position of the second pair of Hall sensors IC11, IC12 correspond to the positions of the Hall sensors IC1, IC2 rotated by 90°.

The positions of the Hall sensors within one pair differ by 120° with respect to the rotation axis of the bearing.

The Hall sensors are mounted on an inner ring or an outer ring of the bearing and interact with a magnetic ring mounted on the other ring, preferably the rotating ring of the bearing (not illustrated).

As illustrated in FIG. 4, a first output Vout− is connected to a negative output out− of the first Hall sensor plate IC1 and to the positive output out+ of the second Hall sensor plate IC2 of the pair. In a similar way, the positive output Vout+ of the circuit comprising one pair is connected to the positive output out+ of the first Hall plate IC1 and to the negative output out− of the second Hall plate IC2.

The output of a sensor according to FIG. 1 can be expressed mathematically as the inproduct of the magnetic field vector with a normal vector to the surface of the plate 10 multiplied by a constant plus an offset value. Since the sensor plates IC1, IC2 in FIG. 4 stem from the safe wafer, the offset voltages are highly similar and are compensated due to the anti-parallel connection illustrated in FIG. 4. Due to the different positions of the sensor plates IC1, IC2 with a phase difference of 120°, the magnetic field variations are phase-delayed by 120° such that the residual difference of the signals is a sign-wave without offset as illustrated in FIG. 5c.

Figure 5A:
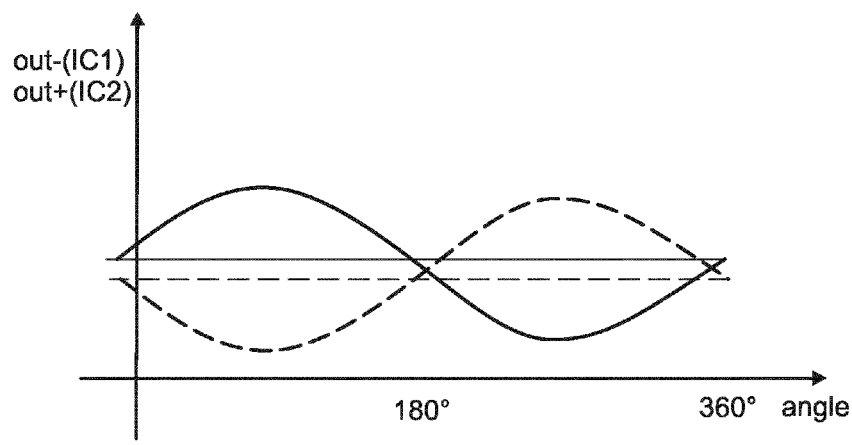
FIGS. 5a, 5b, and 5c are graphs showing output voltages of the individual Hall sensor plates in FIGS. 3 and 4 and the differential output of the circuit in FIG. 4.
Figure 5B:
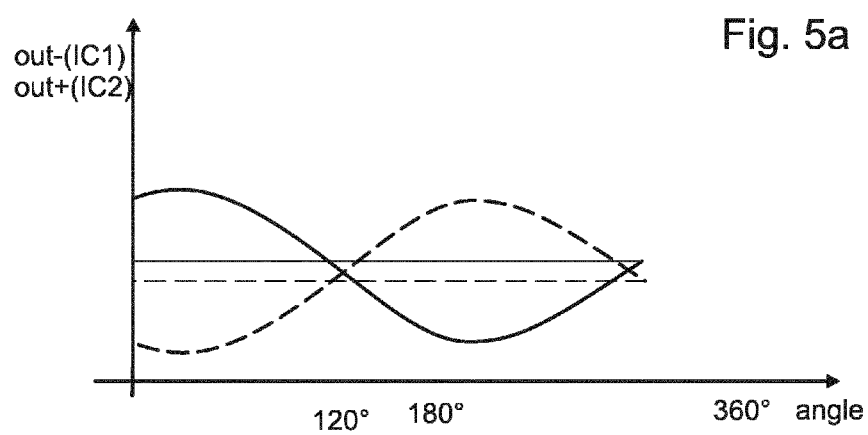
Figure 5C:
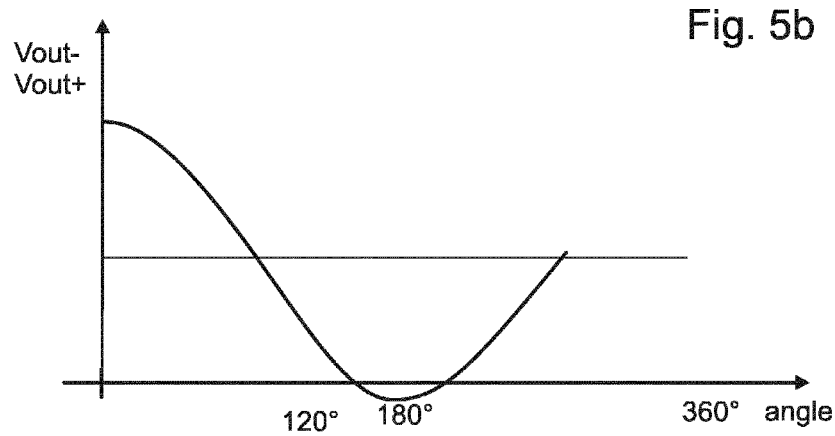

FIG. 5a illustrates the output voltages at the terminals out+, out− of the different sensor plates IC1, IC2 and FIG. 5c is the signal without offset which is achieved by the circuit illustrated in FIG. 4.

Arrangement I in FIG. 3, has the sensors more than a quarter of the rotation of the ring from each other. The sensors have the same offset voltage, have the same internal resistances, but will observe a different field strength. The angular distance is between 90 degrees and 180 degrees, wherein the endpoints of this interval are excluded.

One such pair, sensors dubbed IC1 and IC2 can observe the principal Cosine term of the angle, while a 90 degrees shifted pair may observe the Sine term.

With the resistor bridge nature of these Hall elements we can now make a circuit working at high temperature, unlike with known silicon Hall sensors that include amplifiers and other active elements by nature. Now it only needs wiring between the bridges to create a differential voltage that represents the difference in field at the locations sensed around the ring, while the circuit can be arranged such that the offset voltage of the sensors are canceling each other.

The differential output voltage V+out minus V−out is the difference of the Hall voltages generated by the B field inproduct with the normal vectors at the different locations around the magnetic ring. However the offset voltage is the same by the nature of the reproducibility in GaAs, so they will be in anti-parallel and therefore will cancel each other. The requirement to be able to do this electrically anti-parallel connection is that the effective values of the resistors in the Hall elements are quite accurately the same. Also this has been fulfilled already in the manufacturing process of these cells.

The waveforms from IC1 and IC2 are shown in FIGS. 5a and 5b, together with the result if they are switched electrically in anti-parallel in FIG. 5c.

Figure 6:
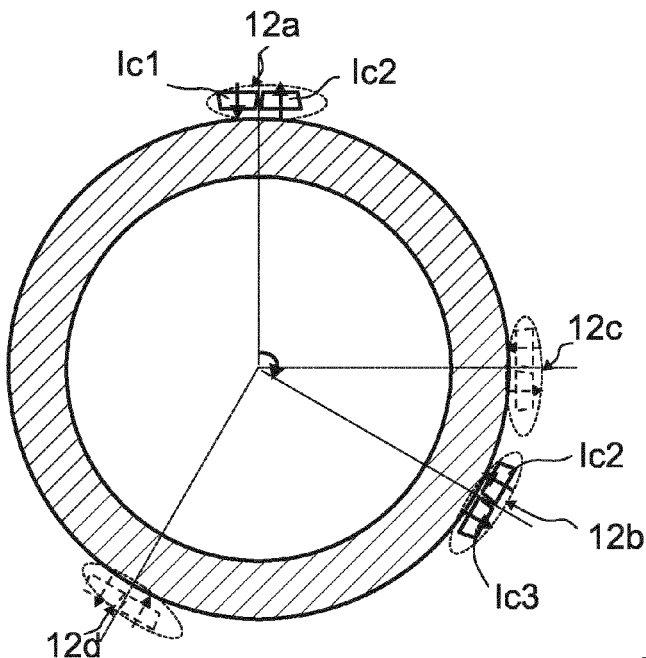
FIG. 6 is a schematical representation of a second embodiment of the invention.
Figure 7:
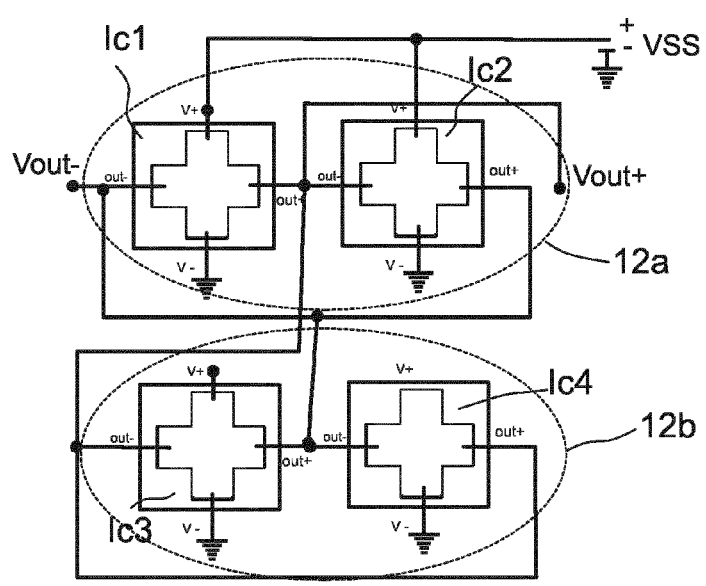
FIG. 7 is a schematical representation of a wiring scheme of the sensor arrangement according to FIG. 5.

FIG. 6 illustrates a second embodiment of the invention which basically corresponds to the Arrangement I of FIG. 3, wherein only each sensor unit 12a-12d comprises pair of sensor plates connected in anti-parallel way as illustrated in FIG. 4 and provided in one housing or separate housings arranged closed to one another (angular distance preferably less than 60°) and wherein the two pairs of sensor plates are connected as illustrated in FIG. 7. In other words, each sensor unit 12a-12d mounted on a ring of the bearing comprises two sensor plates wired as in FIG. 4 which are preferably arranged in one housing and originate from the same batch/wafer. Preferably, all of the four sensor plates contained in one pair of sensor units are made from the same semi-conductor wafer.

As illustrated in FIG. 7, the principle of anti-parallel connection as illustrated in FIG. 4 is repeated on the level of the sensor units in that the positive output of a first sensor unit of one pair of sensor units is connected with a negative output of a second sensor unit of the same pair of sensor units and vice versa.

Arrangement II can be made using the electric diagram illustrated in FIG. 7.

Arrangement II in FIG. 6 uses anti-parallel oriented sensors IC1 and IC2 in pairs to measure nearly the same vector at one location and the other pair IC3 and IC4 the other location. The distance between the second pair can again be anywhere from 90 to 180 degrees from the first pair. In practice the package will limit how close the two can be fitted together in a pair, but it should effectively not exceed about ⅛th of a circumferential length of the pole pair on a magnetic ring. In multi pole rings therefore the pairs may be distributed with a distance of any integer of the pole pair size to overcome this limitation.

Note that the appropriate Sine component of the angle of this example ring in the drawing can be produced with Sensor pairs IC11, IC12 and IC 13, IC 14.

The orientation of IC1 is mechanically opposite to IC2, while the B field locally is nearly the same. Therefore the IC1 will give a positive output equal in size but of opposite electric sign as IC2. The offset voltage is however equal both in size and sign. Putting the two electrically in anti-parallel, the offset is canceled while the mean B measurement of IC1 and IC2 is preserved.

The rest of the diagram is a further copy of arrangement I where IC1 of Arrangement I is replaced by IC 1 and IC2 in arrangement II, and IC2 of arrangement I is replaced with the combination of IC3 and IC4 in arrangement II.

The expansion into more phases is now logical too. Instead of a sine-cosine orthogonal pair of electrical signals, it is possible to copy the circuit in more locations to provide N=3, 4, 5 or any more vectors with regular electrical phase spacing. The signals can be combined into an angle by calculating the product of the sine of the angle and the vector values measured in this way with N positions.

In an alternative embodiment of the invention (not illustrated), the Hall sensor arrangement is driven with an AC supply with a carrier frequency generated by the controller unit that needs to interpret it. The differential AC signals are filtered and amplified and then using synchronous detection the amplitude response is demodulated back to the representative values.

Measurements have been done with an available device, HE144, from ASensor AB, who produce and market GaAs products. The difference in offset between individually packaged dice has a worst case variation of about +/−0.0001 Volt under 5 volt (equivalent to 5 mA drive current) supply conditions, with a typical offset voltage of individual cells of 0.050 V under these circumstances.

Measurements show an offset reduction of at least a factor 50. Selected pairs from the factory may reduce this another factor 50, leading to realistic offsets of 1 microvolt when used in anti-parallel circuits as described above.

The invention proposes to distribute the pairs of offset canceling chips over the circumference of the magnetic ring/bearing. It is proposed to use a distance between ¼ to ½ of "wavelength" between the pairs. The cancelation is not achieved by adding or subtracting but directly putting the chips in (anti) parallel. As they are resistor bridges, which are highly reproducible (between individuals from one and the same wafer) we can make in this way a sensor bearing that needs no active elements nor any additional passive elements in the electronic circuit. This decreases the cost price for high temperature circuitry with orders of magnitude.

Additionally it is in principle possible to use an AC voltage as supply instead of a DC voltage. The output is then also AC voltage, proportional to the local normal field strength difference at the two locations of the individuals in the bridge. In principle this can run at a frequency normally used by the RVDT units as supplied by TT/Tyco and Tamagawa, and treated by the same kind of resolver to digital chipset. In other words, a semiconductor equivalent of a resolver is then feasible.

The invention claimed is:

1. A sensor assembly for use in sensor bearings, the sensor assembly comprising:
   a controller generating an alternating current (AC) drive voltage for driving the sensor units and for interpreting the sensor results; and
   at least two sensor units configured to be arranged on a ring of the sensor bearing in different angular positions with regard to a rotation axis of the bearing,
   wherein each of the at least two sensor units comprises at least one hall sensor plate,
   wherein at least two hall sensor plates of different sensor units are wired in antiparallel orientation to compensate offset voltages of the hall sensor plates,
   wherein substrates of the at least two sensor units are biased to form a non-conducting and capacitance barrier,
   wherein the at least two hall sensor plates of different sensor units comprise GaAs semiconductor plates of a same offset voltage and a same internal resistance, while observing a different field strength,
   wherein the elements of each pair of sensor units are arranged at an angular distance between 90° and 180°, excluding 90° and 180°.

2. The sensor assembly according to claim 1, wherein the at least two hall sensor plates of different sensor units are manufactured from the same semiconductor wafer.

3. The sensor assembly according to claim 1, wherein the at least two sensor units are arranged at an angular distance between 90° and 180°, excluding 90° and 180°.

4. The sensor assembly according to claim 3, wherein the at least two sensor units are arranged at an angular distance between 100° and 150°.

5. The sensor assembly according to claim 1, wherein the two sensor plates wired in antiparallel orientation are arranged next to one another at an angular distance of not more than 60°.

6. The sensor assembly according to claim 1,
   wherein the positions of a second pair of sensor units are displaced by a predetermined phase angle with respect to the positions of a first pair of sensor units.

7. The sensor assembly according to claim 6, wherein the predetermined phase angle amounts to 90°.

8. The sensor assembly according to claim 1, wherein each sensor unit comprises one pair of hall sensor plates wired in antiparallel orientation.

9. A method for manufacturing a sensor assembly, the sensor assembly comprising:
   the sensor assembly comprising:
   a controller generating an AC drive voltage for driving the sensor units and for interpreting the sensor results; and
   at least two sensor units configured to be arranged on a ring of the sensor bearing in different angular positions with regard to a rotation axis of the bearing,
   wherein each of the at least two sensor units comprises at least one hall sensor plate,
   wherein at least two hall sensor plates of different sensor units are wired in antiparallel orientation to compensate offset voltages of the hall sensor plates,
   the method comprising:
   manufacturing the at least two hall sensor plates based on parts of one single semiconductor wafer,
   wherein the parts of one single semiconductor wafer are biased to form a non-conducting and capacitance barrier,
   wherein the at least two hall sensor plates of different sensor units comprise GaAs semiconductor plates of a same offset voltage and a same internal resistance, while observing a different field strength,
   wherein the elements of each pair of sensor units are arranged at an angular distance between 90° and 180°, excluding 90° and 180°.

* * * * *